United States Patent [19]

Tokuda et al.

[11] Patent Number: 5,144,397
[45] Date of Patent: Sep. 1, 1992

[54] LIGHT RESPONSIVE SEMICONDUCTOR DEVICE

[75] Inventors: Yasunori Tokuda; Noriaki Tsukada, both of Amagasaki, Japan

[73] Assignee: Mitsubishi Denki Kabushiki Kaisha, Japan

[21] Appl. No.: 487,292

[22] Filed: Mar. 2, 1990

[30] Foreign Application Priority Data

| Mar. 3, 1989 | [JP] | Japan | 1-52651 |
| Mar. 3, 1989 | [JP] | Japan | 1-52652 |
| Mar. 8, 1989 | [JP] | Japan | 1-55497 |
| Mar. 8, 1989 | [JP] | Japan | 1-55498 |
| Nov. 22, 1989 | [JP] | Japan | 1-301935 |

[51] Int. Cl.$^5$ ............... H01L 29/161; H01L 29/205; H01L 29/225
[52] U.S. Cl. ............... 357/30; 357/4; 357/16; 357/58
[58] Field of Search ............... 357/30 E, 58, 4, 16

[56] References Cited

U.S. PATENT DOCUMENTS

| 4,205,331 | 5/1980 | Esaki et al. | 357/30 E |
| 4,297,720 | 10/1981 | Nishizawa et al. | 357/30 E |
| 4,786,951 | 11/1988 | Tokuda et al. | 357/17 |
| 4,833,511 | 5/1989 | Sugimoto | 357/30 E X |
| 4,843,439 | 6/1989 | Cheng | 357/30 E X |

FOREIGN PATENT DOCUMENTS

| 55-93275 | 7/1980 | Japan | 357/30 E |
| 57-62573 | 4/1982 | Japan | 357/30 E |

OTHER PUBLICATIONS

Bar-Joseph et al, "Self-Electrooptic Effect Device and a Modulation Converter with InGaAs/InP Multiple Quantum Wells", Conference on Lasers and Electro-Optics, Technical Digest Series, vol. 7, Apr. 1988, pp. 52-53.
Wood et al, "High Speed 2×2 Electrically Driven Spatial Light Modulator Made with GaAs/AlGaAs Multiple Quantum Wells (MOWs)", Electronics Letters, vol. 23, No. 17, 1987, pp. 916-917.
Livescu et al, "High-Speed Absorption Recovery in Quantum Well Diodes by Diffusive Electrical Conduction", Applied Physics Letters, vol. 54, No. 8, 1989, pp. 748-750.
Tokuda et al, "Incident Wavelength Dependence of Photocurrent Bistability by External Bias Voltage Control in a Quantum Well p-i-n Diode", Applied Physics Letters, vol. 55, No. 8, 1989, pp. 711-712.
Tokuda et al, "Self-Deformed and Hysteretic Photocurrent Spectra of Quantum Wells with a Load Resistor", Applied Physics Letters, vol. 54, No. 23, 1989, pp. 2324-2326.
Lentine et al, "Symmetric Self-Electro-Optic Effect Device: Optical Set-Reset Latch", Applied Physics Letters, vol. 52, No. 17, 1988, pp. 1419-1421.
Larsson et al, "High-Speed Dual-Wavelength Demultiplexing and Detection in a Monolithic Superlattice p-i-n Waveguide Detector Array", Aug. 4, 1986, Appl. Phys. Lett., pp. 233-235.
Wood et al, "Wavelength-Selective Voltage-Tunable Photodetector Made from Multiple Quantum Wells", Aug., 1985, Appl. Phys. Lett., pp. 190-192.
Miller et al, "Novel Hybrid Optically Bistable Switch: The Quantum Well Swlf-Electro-Optic Effect Device", Jul. 1, 1984, Appl. Phys. Lett., pp. 13-15.
Cappasso et al, "Enhancement of Electron Impact Ionization in a Superlattice: A New Avalanch Photodiode with a Large Ionization Rate Ratio", Jan., 1982, Appl. Phys. Lett., pp. 38-40.

Primary Examiner—Andrew J. James
Assistant Examiner—Sara W. Crane
Attorney, Agent, or Firm—Leydig, Voit & Mayer

[57] ABSTRACT

A light responsive semiconductor device includes a p-i-n structure incorporating a multiple quantum well structure buried within the intrinsic layer and an external resistance and voltage source serially connected across the device for adjusting a critical wavelength at which the light absorption characteristic of the device dramatically changes. By properly choosing the resistance and/or voltage, the photocurrent changes discontinuously at the critical wavelength and the photocurrent exhibits a hysteresis characteristic. A light responsive structure may include individual, serially aligned p-i-n devices or an integrated, unitary semiconductor body inculding a plurality of p-i-n devices.

2 Claims, 8 Drawing Sheets

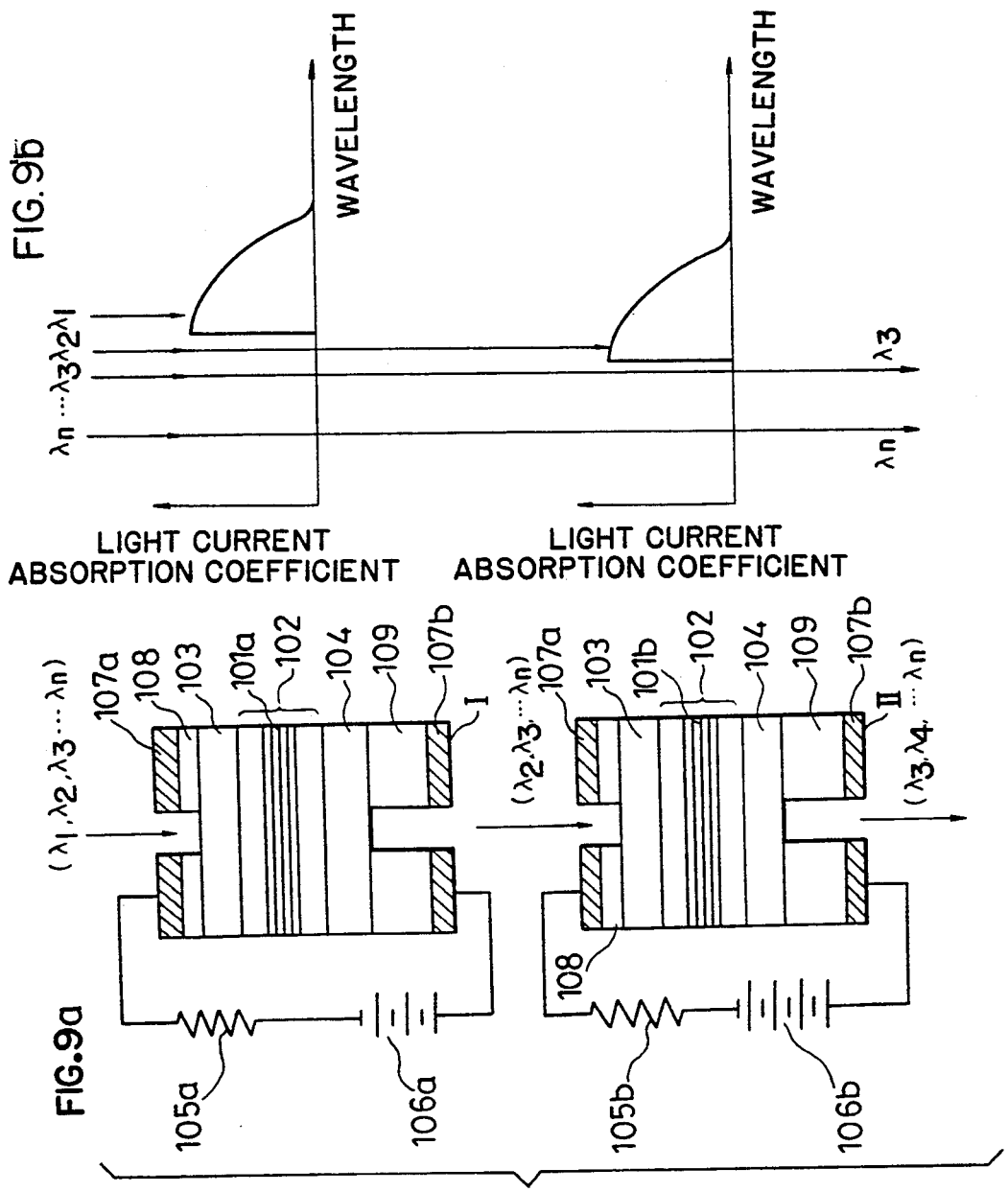

LIGHT RESPONSIVE SEMICONDUCTOR DEVICE

FIELD OF THE INVENTION

The present invention relates to a light responsive semiconductor device which may be used as a photodetector or a switch responsive to light. The present invention particularly relates to a photodetector responding with very high selectivity only to monochromatic light having a wavelength lying beyond a critical wavelength.

BACKGROUND OF THE INVENTION

FIG. 1 is a cross-sectional view of the structure of a photodetector incorporating a superlattice structure in a light absorption layer as shown in *Applied Physics Letters*. Volume 47, Number 3, Aug. 1, 1985, pages 190–192. In that structure, a multiple quantum well light absorption layer 1 is buried within an intrinsic layer 2. The intrinsic layer is sandwiched between a p-type layer 3 and an n-type layer 4. Electrodes 7 are disposed on p-type layer 3 and n-type layer 4, respectively.

When the structure of FIG. 1 is reverse biased, the absorption peak with respect to wavelength for incident light in the multiple quantum well structure is shifted toward longer wavelengths by the quantum confined Stark effect. This structure provides high wavelength selectivity based upon the electric field produced by the external bias applied to the structure. However, this structure cannot distinguish between two different wavelengths in incident light when there is only a small difference between the two wavelengths.

A photodetector employing a self electro-optic effect and producing a bistable output signal as a function of input light intensity is described in *Applied Physics Letters*. Volume 45, Number 1, July 1, 1984, pages 13–15. However, that article does not describe any relationship between the bistable output signal and the wavelength of the incident light.

An apparatus for detecting a particular wavelength light signal in a multiple wavelength light communication system is described in *Japanese Society of Electronics and Communication Engineering*, Volume 63, Nov. 1980, page 1185, and illustrated in FIGS. 2 and 3. As shown in FIG. 2, light including wavelengths $\lambda_1$ and $\lambda_2$ is incident on a diffraction grating 8 which disperses the different wavelength components into separate beams. Those beams are respectively incident on photodetectors 9a and 9b which are positioned relative to the diffraction grating 8 to receive the respective beams and convert them into electrical signals. In FIG. 3, the light including wavelengths $\lambda_1$ and $\lambda_2$ is incident on a transparent plate 10 having parallel surfaces. The light of wavelength $\lambda_1$ is transmitted through the plate and an interference filter 11 tuned to that wavelength. The transmitted light of wavelength $\lambda_1$ is incident on photodetector 9a which generates an electrical signal in response to the incident light. The light of wavelength $\lambda_2$ is internally reflected within the plate 10 and transmitted through an interference filter 12 tuned to wavelength $\lambda_2$. The transmitted light is incident on photodetector 9b which generates an electrical signal in response.

Although the diffraction grating arrangement of FIG. 2 produces an acceptable spatial separation between the different wavelength components of the incident light, the geometric constraints require that the angle of the incident light be constant. The apparatus of FIG. 3 provides an inferior separation of the different wavelengths and requires additional expensive elements, namely, the interference filters 11 and 12. In addition, the arrangements of FIGS. 2 and 3 include distinct wavelength separation and detection sections which do not have wavelength tuning capability.

SUMMARY OF THE INVENTION

It is an object of the present invention to provide a light responsive semiconductor device which has enhanced wavelength selectivity and produces a bistable output current as a function of the wavelength of incident light.

It is another object of the present invention to provide a light responsive semiconductor device providing an output signal that changes dramatically at a particular wavelength of incident light.

It is a further object of the present invention to provide a light responsive semiconductor device that divides incident light including several monochromatic light signals into independent output signals with very high wavelength selectivity.

It is still another object of the present invention to provide a method of converting, with very high wavelength selectivity, monochromatic light of a particular wavelength into an electrical signal.

Other objects and advantages of the present invention will become apparent from the detailed description given herein. It should be understood, however, that the detailed description and specific embodiments are described for illustration only since various changes and modifications within the spirit and scope of the invention will become apparent to those skilled in the art from the detailed description.

BRIEF DESCRIPTION OF THE DRAWINGS

FIG. 9 is a diagram illustrating a photodetection method according to the invention.

DETAILED DESCRIPTION OF THE PREFERRED EMBODIMENTS

Figure 1:
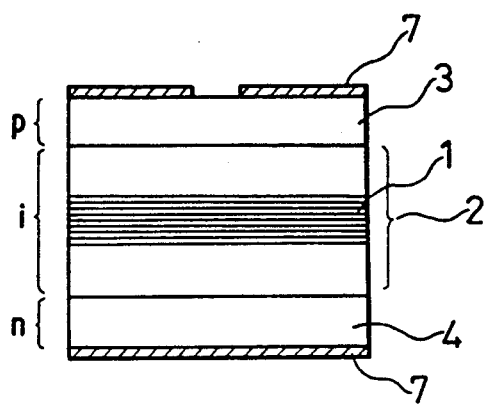
FIG. 1 is a cross-sectional view of a prior art photodetector including a multiple quantum well structure.
Figure 2:
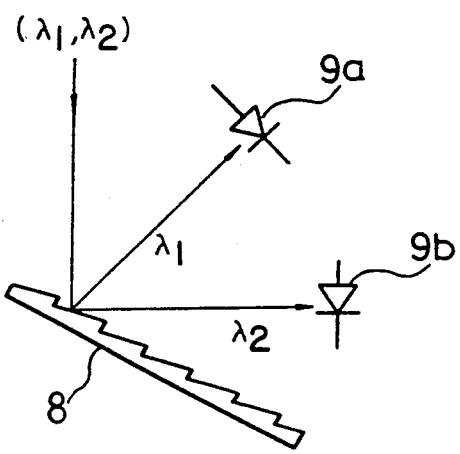
FIG. 2 is a schematic diagram of a wavelength selective light detection apparatus incorporating a diffraction grating.
Figure 3:
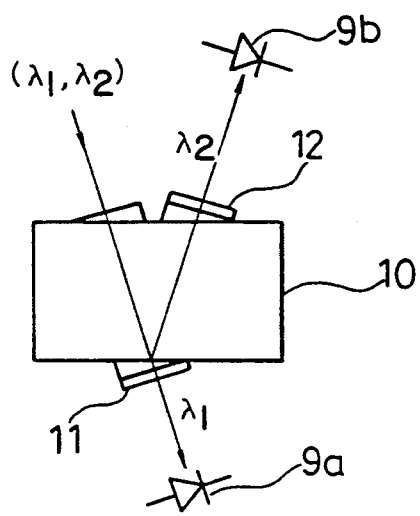
FIG. 3 is a schematic diagram of a wavelength selective light detection apparatus incorporating interference filters.
Figure 4:
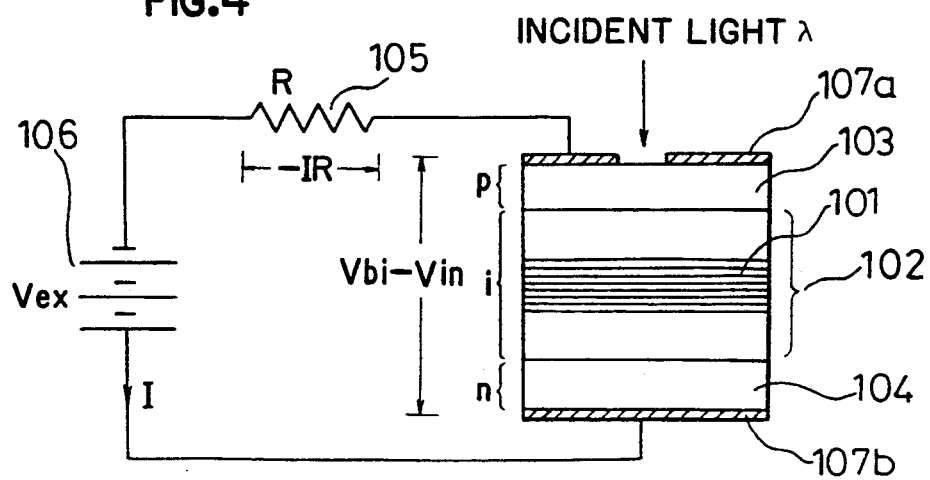
FIG. 4 is a schematic diagram of a light responsive semiconductor device according to an embodiment of the invention.

In FIG. 4, a light responsive semiconductor device according to an embodiment of the invention includes a multiple quantum well structure 101 buried within an intrinsic layer 102. The multiple quantum well structure may include twenty quantum well layers of GaAs, each about 100 Angstroms thick, alternating with twenty quantum barrier layers of AlGaAs, each about 100 Angstroms thick. These layers may be grown by advanced techniques, such as molecular beam epitaxy. The multiple quantum well structure is sandwiched between intrinsic layers of AlGaAs, each about 500 Angstroms thick, to complete the intrinsic layer 102.

Intrinsic layer 102 is sandwiched between a p-type AlGaAs layer 103 and an n-type AlGaAs layer 104. Layers 103 and 104 are each about 5,000 Angstroms thick and doped to a concentration of about $5 \times 10^{17} cm^{-3}$ with Be and Si, respectively. An electrode 107a of CrAu about 2,000 Angstroms thick is disposed on layer 103. Electrode 107a includes an aperture or window, for example, a circular opening 800 microns in diameter, through which incident light reaches the p-type layer 103. An electrode 107b, for example, of AuGe/Ni/Au is disposed on layer 104 to complete the device. This p-i-n device may have a rectangular configuration about 1 millimeter on each side.

In FIG. 4, the device is connected in a circuit including a resistor 105 and a constant voltage power supply 106, the cathode of which is electrically connected to electrode 107a through resistor 105. The anode of power source 106 is connected to electrode 107b. The power supply 106 voltage $V_{ex}$ may be about one volt.

Figure 5A:
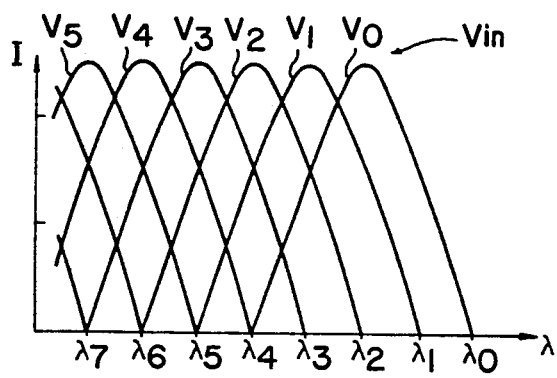
FIGS. 5(a), 5(b), and 5(c) are diagrams illustrating the light responsive characteristics of the device shown in FIG. 4.

FIG. 5(a) shows the photocurrent that flows in the device of FIG. 4 as a function of the wavelength of incident light when different external voltages $V_{ex}$ are applied by the power source 106 without resistor 105 in the circuit. The voltage $V_{in}$, the parameter for the current versus wavelength curves plotted in FIG. 5(a), is the algebraic sum of the external applied voltage $V_{ex}$ and the inherent internal, built-in voltage $V_{bi}$ resulting from the junctions within the device. From FIG. 5(a), the relationship between the internal voltage $V_{in}$ as a function of the photocurrent, with the wavelength of incident light as a parameter, can be obtained. The resulting relationship is plotted in FIG. 5(b).

Figure 5B:
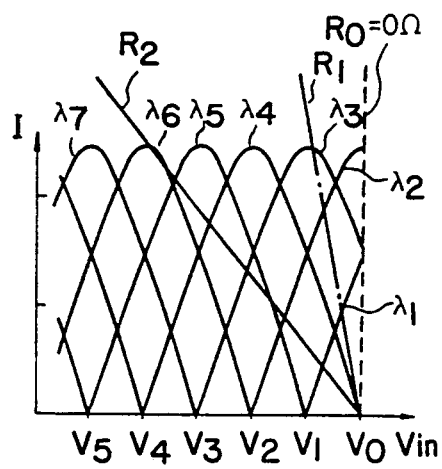

FIGS. 5(a) and 5(b) illustrate the relationships between the internal voltage $V_{in}$ and $V_{ex}$ which equals $V_o$ when, as here, the resistance R=0. In general, the photocurrent is a function of incident light wavelength $\lambda$, the incident light intensity $P_{in}$, and the internal voltage $V_{in}$, that is $$V_{in} = V_o - I(V_{in}, P_{in}, \lambda)R.$$

When resistor 105 is connected as shown in FIG. 4, a load line having a slope determined by the resistance of resistor 105 can be drawn, as shown in FIG. 5(b), to predict performance. Depending upon the value of resistor 105, i.e., on the slope of the load line, the response of the device in the circuit of FIG. 4 may take various forms as shown in FIG. 5(c).

Figure 5C:
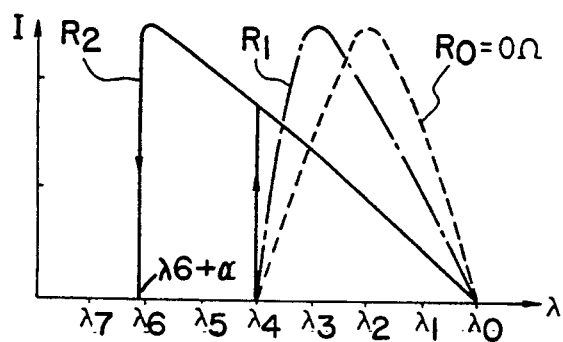

As shown in FIG. 5(c), when no external resistor 105 is connected, i.e., R=0, the same photocurrent as a function of wavelength is obtained as when $V_{in} = V_o$ in FIG. 5(a). As the value of R increases, the response characteristic changes as indicated in FIG. 5(c) by curves $R_1$ and $R_2$, representing increasing resistance. Those curves in FIG. 5(c) are obtained from the intersections of the individual curves of FIG. 5(b) with the respective load lines as drawn in FIG. 5(b) using conventional circuit analysis techniques for active devices. FIG. 5(c) illustrates a shift in the wavelength of peak photocurrent response toward shorter wavelengths and deformation of the spectrum, i.e., response curve, as the value of R increases.

The load line for resistance $R_1$ only intersects each wavelength curve of FIG. 5(b) once, resulting in the dot-dash R curve of FIG. 5(c). However, the increased slope of load line $R_2$ causes it to intersect each wavelength curve in FIG. 5(b) at two points, indicating bistable operating points as well as hysteresis. For example, dual operating points are produced for wavelengths ranging from $\lambda_4$ to $\lambda_6 + \alpha$. As a result of this hysteresis, the solid response curve of FIG. 5(c) for load line Rz is obtained. That curve includes two vertical or essentially vertical portions where the photocurrent changes rapidly and discontinuously. Even if the load resistance is not high enough to produce hysteresis, FIG. 5(c) shows that the change in photocurrent as a function of wavelength when the incident light is approximately at the wavelength $\lambda_4$ is very large as a function of wavelength.

In the embodiment of the invention illustrated in FIG. 4, the solid load line $R_2$ of FIG. 5(c) is employed to provide a very high wavelength selectivity for wavelength $\lambda_4$. At wavelengths between $\lambda_4$ and $\lambda_6 + \alpha$, the device responds at the photocurrent corresponding to $\lambda_4$. In other words, when monochromatic light of wavelength shorter than $\lambda_4$ is incident on the device, a photocurrent less than a current I flows. When the wavelength reaches $\lambda_4$, the photocurrent changes to a value I, indicating, with very high selectively, the presence of the selected wavelength.

In FIG. 4, a reverse bias voltage is applied by power supply 106. However, depending upon the critical wavelength $\lambda_c$ (i.e., $\lambda_4$ with respect to FIG. 5(c)), an external voltage may not be required and resistor 106 may be connected directly between electrodes 107a and 107b. When it is desired to vary the critical wavelength, a variable external applied voltage $V_{ex}$ is used because the existence and width of the hysteresis effect depends upon the value of the applied external voltage.

The drastic change, i.e., the discontinuous change, of the photocurrent flowing through the light responsive device according to the invention as a function of the wavelength of incident light makes the device particularly useful in apparatus where wavelength has significance in information transmission. Optical multiplex communications systems are one example of systems in which wavelength critical optical detection is of high significance.

Figure 6:
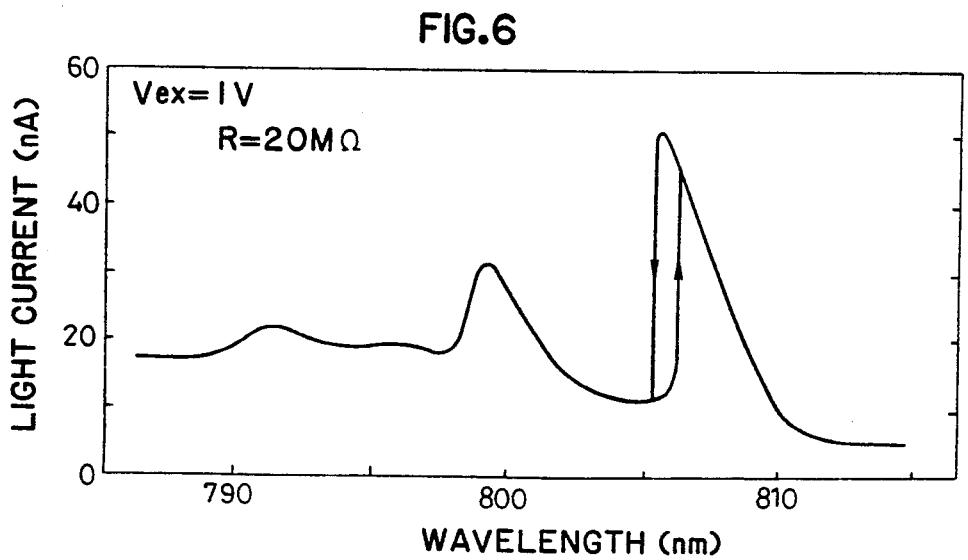
FIG. 6 is a graph of the measured response characteristics of the device of FIG. 4.

FIG. 6 shows a measured characteristic of a device according to the invention. A voltage of one volt was applied to the device and a load resistance of 20 megohms was applied while monochromatic incident light was varied in wavelength. As shown in FIG. 6, the photocurrent increased dramatically at a wavelength of about 805 nm. The response characteristic shows a hysteresis only one or two nanometers in width, corresponding to an exciton transition between n=1 heavy hole and n=1 electron.

Figure 7:
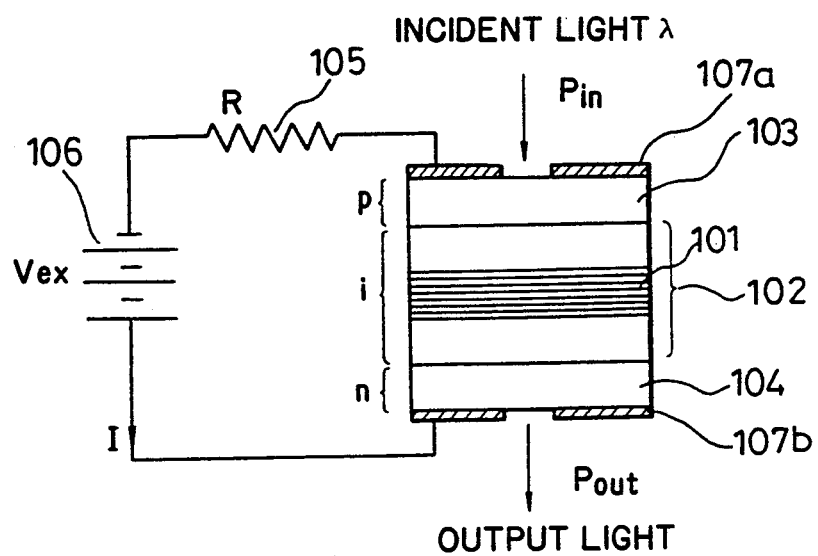
FIG. 7 is a schematic diagram of a light responsive semiconductor device according to an embodiment of the invention.

Another embodiment of the invention is illustrated in FIG. 7. In the embodiment of FIG. 7, the bistable property applies to light transmitted through the device rather than to the photocurrent flowing through the device. The construction of the photoresponsive device shown in FIG. 7 is the same as that shown in FIG. 4 except that electrode 107b also includes a window or aperture, for example, a circular opening 800 microns in diameter, aligned with the opening in electrode 107a, for the transmission of an output signal, i.e., the output light, $P_{out}$.

Figure 8A:
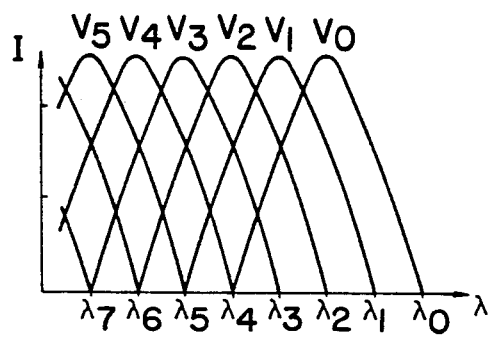
FIGS. 8(a), 8(b), 8(c), and 8(d) are diagrams illustrating the light responsive characteristics of the device shown in FIG. 7.
Figure 8B:
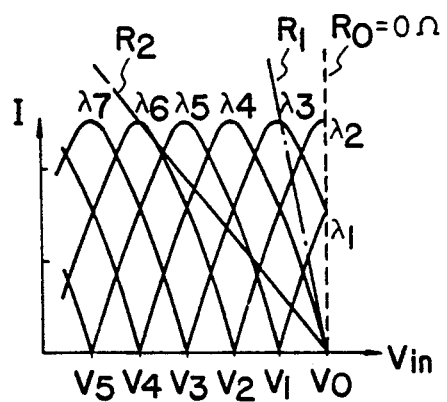
Figure 8C:
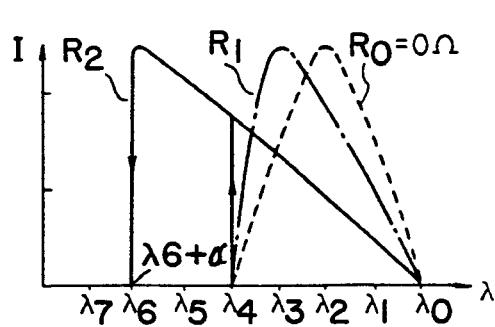
Figure 8D:
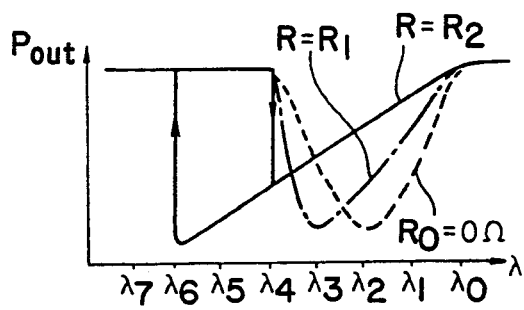

FIGS. 8(a), 8(b), and 8(c) correspond to those shown in FIGS. 5(a), 5(b), and 5(c), respectively, but apply to the device of FIG. 7. In general, a photocurrent flows in the resistor 105 in response to absorbed light. As a result, based on the photocurrent as a function of wavelength shown in FIG. 8(c), the intensity of the output light $P_{out}$, as a function of the wavelength of the incident light, is as shown in FIG. 8(d). As is apparent from FIG. 8(d), the output light $P_{out}$ has a bistable characteristic as a function of wavelength and has two stable operating points in the wavelength region between $\lambda_4$ and $[_6+\alpha$ for a resistance corresponding to load line $R_2$, i.e., the solid line of FIG. 8(d).

The solid response curve of FIG. 8(d) shows a very high selectivity with respect to the critical wavelength $\lambda_4$. When incident light having a wavelength shorter than $\lambda_4$ is incident on the device, a photocurrent less than I flows and the output light $P_{out}$ signal is relatively strong. When incident light having a wavelength longer than $\lambda_4$ is present, a photocurrent I flows and the output light signal $P_{out}$ is relatively weak. The device thereby functions as a filter which transmits monochromatic incident light having a wavelength shorter than $\lambda_4$, i.e., shorter than the critical wavelength. Even if the hysteresis property does not occur, as with curves $R_1$ and $R_o$ of FIG. 8(d), the output light signal $P_{out}$ changes rapidly at a particular wavelength of incident light as disclosed in FIG. 8(d) for those other load lines. Moreover, as with the embodiment of the invention depicted in FIG. 4, the critical wavelength and bistable characteristics can be changed by changing the externally applied voltage $V_{ex}$, by the intensity of the incident light $P_{in}$, and the load resistor R.

A device according to the invention and having the structure shown in FIG. 7 can be used as a key element of an optical information processing system such as a filter, an optical memory, an optical modulator, or a photodetector, all with very high wavelength selectivity.

FIG. 9 illustrates another embodiment of the invention which is an application of the novel functions of the light responsive semiconductor device described with respect to FIG. 7. In FIG. 9, monochromatic light components of particular wavelengths in a beam of light are individually detected. In FIG. 9, light responsive semiconductor devices I and II are disposed in alignment so that light incident on device I that is transmitted through that device is then incident on device II. The incident light in this example. includes monochromatic components $\lambda_1, \lambda_2, \ldots \lambda_n$. Device I only absorbs the monochromatic light component of wavelength $\lambda_2$ from the incident light beam. Device II only absorbs the monochromatic light component of wavelength $\lambda_2$ from the incident light beam. The monochromatic components of wavelengths $\lambda_3, \ldots \lambda_n$, which are shorter in wavelength than wavelength $\lambda_2$, are transmitted through devices I and II as a result of the bistable property of that device as described with respect to FIGS. 8(c) and 8(d). Each of devices I and II has the same structure as the embodiment described with respect to FIG. 7 along with layers 108 and 109. Layers 108 and 109 are of the same conductivity types as the respective adjacent semiconductor layers 103 and 104.

Device I includes a constant voltage source 106a connected in series with a resistor 105a and device I. Likewise, device II includes a series-connected constant voltage source 106b and a resistor 105b. These constant voltage power sources and resistors are used to control the absorption characteristics of the respective devices I and II in the manner already described with respect to FIGS. 4 and 7.

The thickness of the quantum well layers in light absorption layer 101i b of device II may be different from those of corresponding elements of device I so that the critical wavelength of device II is shifted toward the shorter wavelengths, e.g., between wavelengths $\lambda_2$ and $\lambda_3$ of the present embodiment.

When light containing several monochromatic components is incident on device I through the window in electrode 107a, the monochromatic component having wavelength $\lambda_1$ is absorbed and converted into a photocurrent. The other monochromatic components are transmitted through device I to device II. In device II, the monochromatic component of wavelength $\lambda_2$ is absorbed and converted into a photocurrent. In this embodiment, it can be determined whether a component of wavelength $\lambda_1$ is present in the incident light based upon the photocurrent generated in device I. Likewise, the presence of a monochromatic component of wavelength $\lambda_2$ can be determined from the photocurrent that flows in the device II. Moreover, since the devices produce very drastic changes in absorption characteristics with wavelength, the wavelength difference between the monochromatic signals $\lambda_1$ and $\lambda_2$ can be made quite small.

Although FIG. 9 depicts two light responsive devices according to the invention, it is apparent that three or more such devices, serially aligned, can be employed for detecting the presence of monochromatic components of as many wavelengths as light responsive devices are provided. When more than three of the light responsive devices are employed in series, it is particularly important that the lower or deeper stage devices respond very sharply at the shorter critical wavelengths. The devices are arranged so that the succeeding lower stage devices absorb and respond to shorter wavelength light than the preceding devices. In other words, the n-th stage device which receives the light transmitted through the (n−1)th device should absorb a monochromatic light component having a wavelength longer than $\lambda_n$ which is shorter than the wavelength $\lambda_{n-1}$.

As is apparent from the prior description, in the embodiment described with respect to FIG. 9, the external resistors 105 connected in series with the respective devices are preferably chosen to produce the bistable characteristics which result in drastic, discontinuous changes at the respective critical wavelengths $\lambda_c$.

Figure 10:
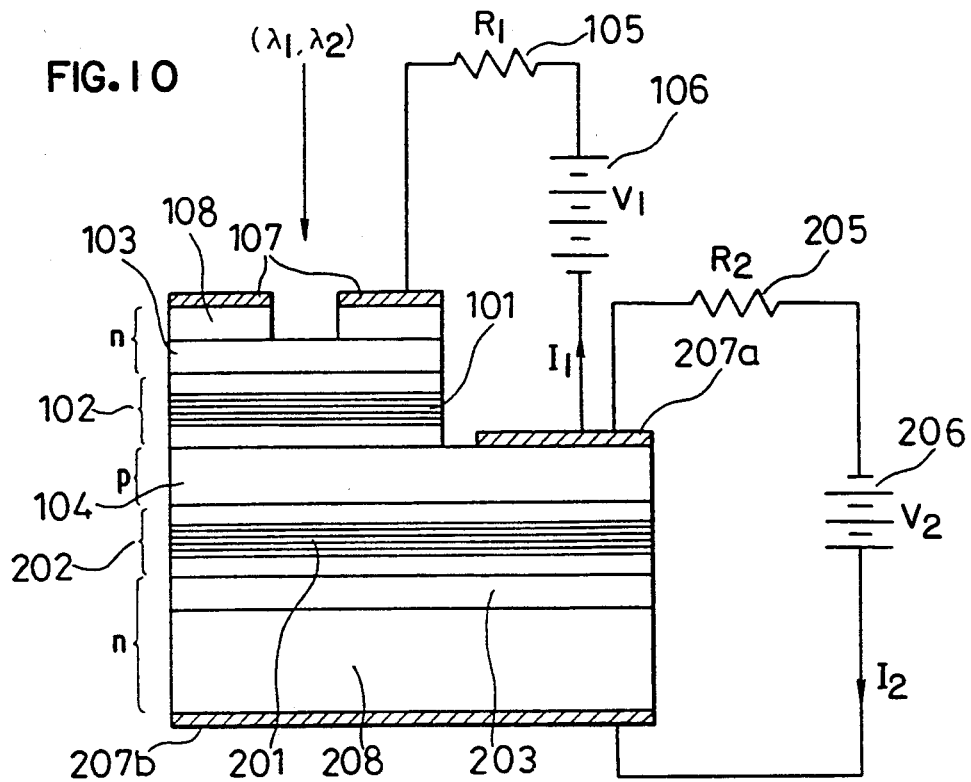
FIG. 10 is a schematic diagram of a light responsive semiconductor device according to an embodiment of the invention.

FIG. 10 illustrates yet another embodiment of the invention. The semiconductor structure shown in FIG. 10 is based upon the principle of the invention described with respect to FIG. 9. The unitary structure of FIG. 10 includes two light responsive elements of the type described with respect to FIG. 9 but integrated into a single semiconductor body. As in the other figures, the elements already described are given the same reference numbers and do not need to be described again.

In FIG. 10, the p-i-n structure comprising layers 104, 102, and 103, respectively, is similar to that of the structure described with respect to FIG. 4. However, a larger number of layers, for example, 30 quantum well and 30 quantum barrier layers, are preferably included in the multiple quantum well structure 101. The total thickness of the AlGaAs layers sandwiching the multiple quantum well. structure to complete intrinsic layer 102 is about 2,000 Angstroms. In addition to the layers described with respect to FIG. 4, the structure of FIG. 10 includes a second n-type layer 108 disposed on n-type layer 103 and including an aperture or window through which incident light reaches n-type layer 103. N-type layer 108 may be GaAs doped with silicon to a concentration of $2 \times 10^{18} cm^{-3}$. The aperture in n-type layer 108 forms part of and is aligned with the window in electrode 107 which corresponds to electrode 107a of FIG. 4. In this embodiment, electrode 107 may include layers of AuGe/Ni/Au to a total thickness of about 2,000 Angstroms.

The p-type layer 104 in the structure of FIG. 10 is preferably AlGaAs doped with Be to a concentration of about $1 \times 10^{18} cm^{-3}$ and having a thickness of about 1 micron. A second electrode 207a is disposed on a portion of p-type layer 104 on the same side of that layer as electrode 107 is located. Second electrode 207a may be CrAu. A first light responsive device component of the structure comprises layers 103, 102, and 104, layer 108, and electrodes 107 and 207a. That first device component absorbs incident light having a wavelength longer than a critical wavelength $\lambda_c$, converts the absorbed light into a photocurrent, and transmits light of wavelengths shorter than the critical wavelength through the p-type layer 104. The first light responsive semiconductor device component of the structure is biased through a resistor 105 and a constant voltage source 106 connected in series between electrodes 107 and 207a. The cathode of the constant voltage power source 106 is connected to electrode 207a.

The second light responsive device component of the structure shown in FIG. 10 includes the p-type layer 104, an intrinsic layer 202, and an n-type layer including layer 203 and a substrate 208. Intrinsic layer 202 incorporates an multiple quantum well structure 201 that may include thirty quantum well layers of GaAs, each about 100 Angstroms thick, and thirty quantum barrier layers of AlGaAs, each about 100 Angstroms thick. The multiple quantum well structure 201 is disposed within the intrinsic layer 202 and sandwiched between layers of AlGaAs that total about 2,000 Angstroms in thickness. N-type layer 203 disposed adjacent the intrinsic layer 202 preferably is AlGaAs about 5,000 Angstroms thick containing silicon as a dopant in a concentration of $5 \times 10^{17} cm^{-3}$. N-type substrate 208 supports the other layers of the structure just described. The substrate 208 is preferably GaAs containing silicon as a dopant to a concentration of about $2 \times 10^{18} cm^{-3}$. A third electrode 207b is disposed on the surface of the substrate 208 and may be AuGe/Ni/Au. This second light responsive device component absorbs light of a wavelength shorter than the critical wavelength of the first device component which has passed through the p-type layer 104 and converts that light into a photocurrent. A second resistor 205 and constant voltage source 206 are connected in series and across second and third electrodes 207a and 207b with the cathode of the power supply connected to electrode 207a.

Figure 11A:
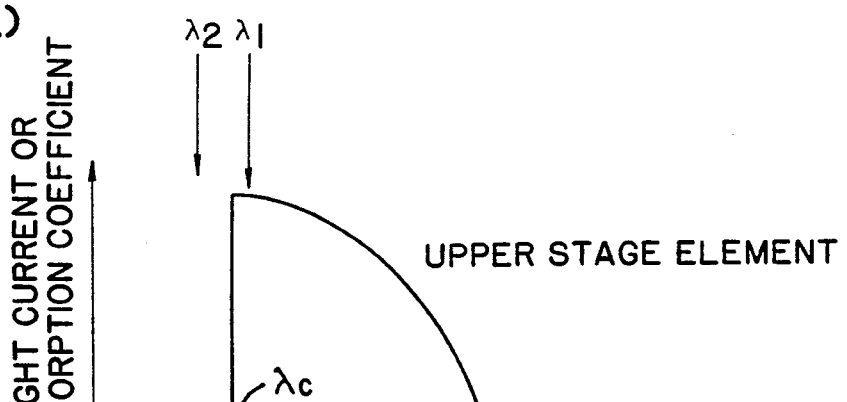
FIGS. 11(a) and 11(b) are diagrams illustrating the light responsive characteristics of the device shown in FIG. 10.
Figure 11B:
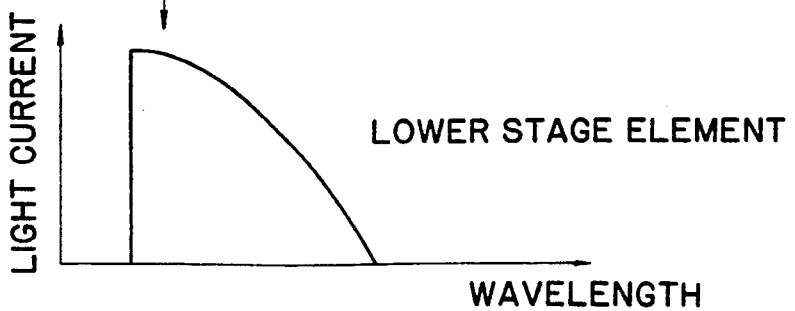

When incident light containing wavelengths $\lambda_1$ and $\lambda_2$ passes through the window of the first electrode 107, the first device component of the structure of FIG. 10 absorbs only the longer wavelength $\lambda_1$ and a photocurrent flows through the circuit including the resistor 105. The shorter wavelength light, i.e., the light of wavelength $\lambda_2$, is transmitted through the first device component and absorbed in the second device component. That absorption results in the flow of a photocurrent in the circuit including resistor 205. As with the other embodiments of the invention described above, the absorption characteristics of the first and second device components can be adjusted by controlling the multiple quantum well structures, the voltage applied by power sources 106 and 206, and/or the values of the resistors 105 and 205. Thereby, the absorption characteristics of the two components can be different even if the multiple quantum well structures are identical. The effect of adjusting the externally applied voltages $V_1$ and $V_2$ of power supplies 106 and 206, respectively, and/or of the resistance values $R_1$ and $R_2$ of the resistors 105 and 205 are illustrated in FIGS. 11(a) and 11(b). There, photocurrent as a function of wavelength is plotted.

In the integrated device structure embodiment of FIG. 10, the changes in absorption characteristics, as a function of wavelength, as illustrated in FIGS. 11(a) and 11(b), is very sharp. Therefore, even when wavelengths $\lambda_1$ and $\lambda_2$ are very close, they can be selectively detected. In other words, this embodiment of the invention also shows that the different absorption characteristics which change rapidly and discontinuously produce very high wavelength selectivity.

Figure 12:
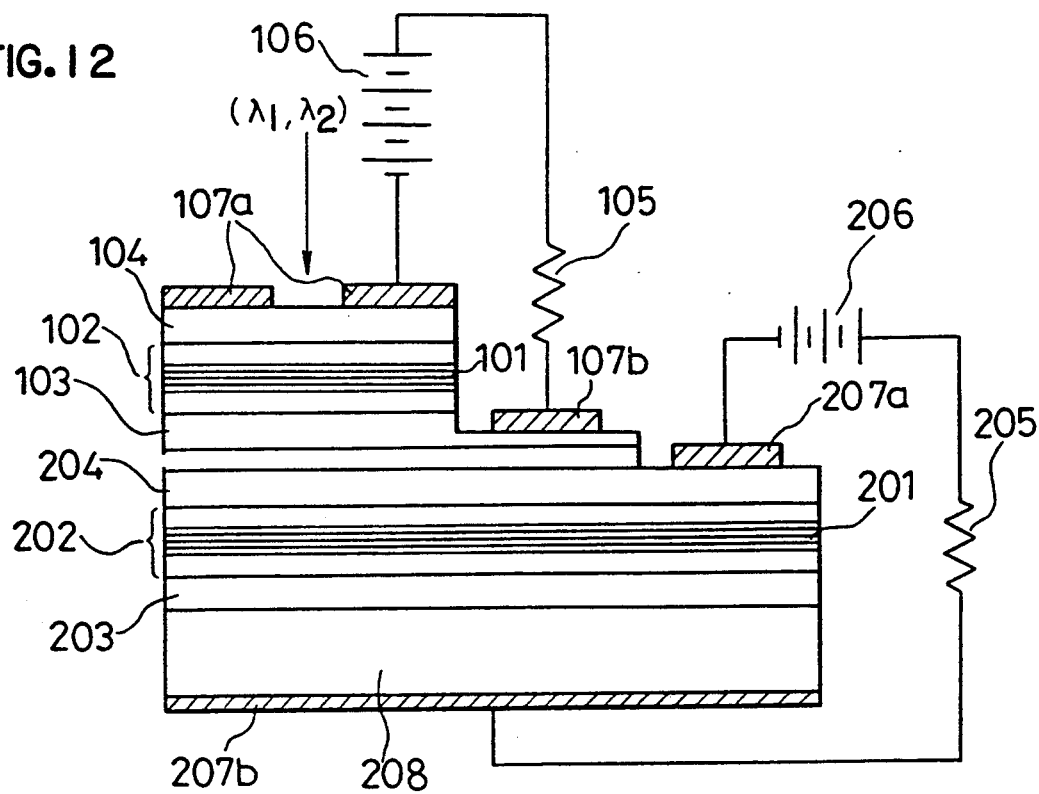
FIG. 12 is a schematic diagram of a light responsive semiconductor device according to an embodiment of the invention.

FIG. 12 shows still another embodiment of the invention. The integrated two device component structure described with respect to FIG. 10 includes an n-i-p-i-n structure. In the embodiment of the invention shown in FIG. 12, an undoped AlGaAs layer 209 is disposed between the separate light responsive device components so that the overall device has a p-i-n-i-p-i-n structure. As is apparent from the structures of FIGS. 10 and 12, additional light responsive device components can be incorporated in a structure. In other words, instead of a two-stage structure as shown in those figures, structures incorporating three or more light responsive device components can be fabricated and more than two different wavelength signals can be independently detected.

Figure 13:
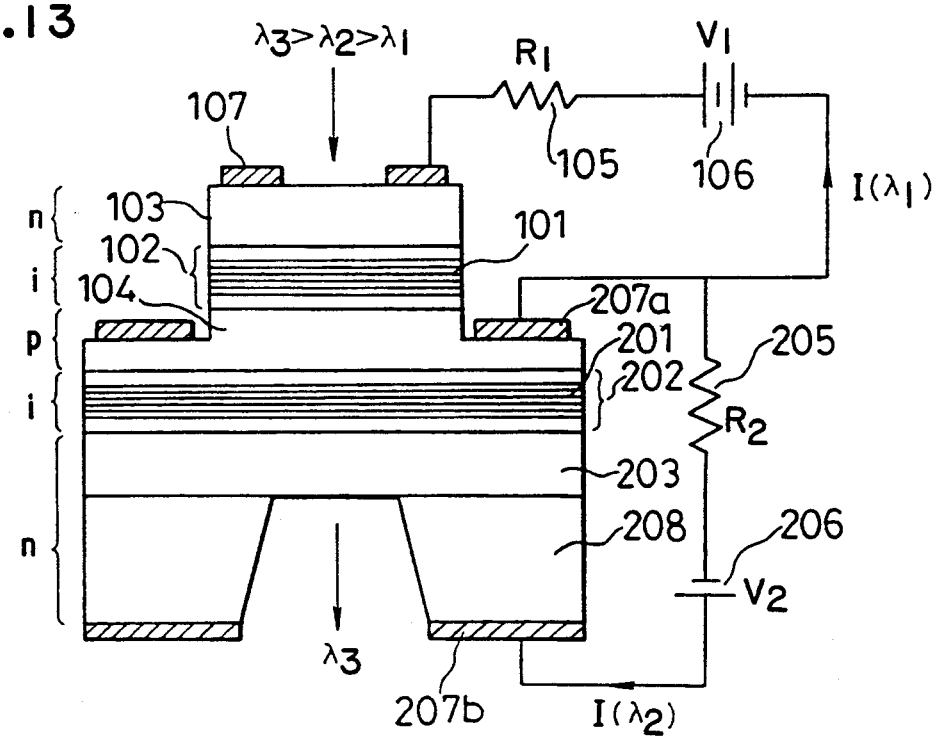
FIG. 13 is a schematic diagram of a light responsive semiconductor device according to an embodiment of the invention.

FIG. 13 shows yet another embodiment of the present invention. That embodiment is similar to those described with respect to FIGS. 10 and 12 but additionally includes a window or aperture extending through substrate 208 and electrode 207b so that light passing through both component devices can exit from the structure. Thus, the structure of FIG. 13 can function in the same fashion as the two independent light responsive devices described with respect to FIG. 9 but integrated into a single semiconductor body.

The embodiments of the invention described with respect to FIGS. 10, 12, and 13 all show a bistable performance over some range of wavelengths. Likewise, the devices show rapid and discontinuous changes in photocurrents at critical wavelengths for detecting the presence of monochromatic light components with extremely high wavelength selectivity by producing electrical signals. Thereby, devices that can detect the presence of more than one wavelength within incident light with high selectivity can be fabricated on a single chip.

Figure 14:
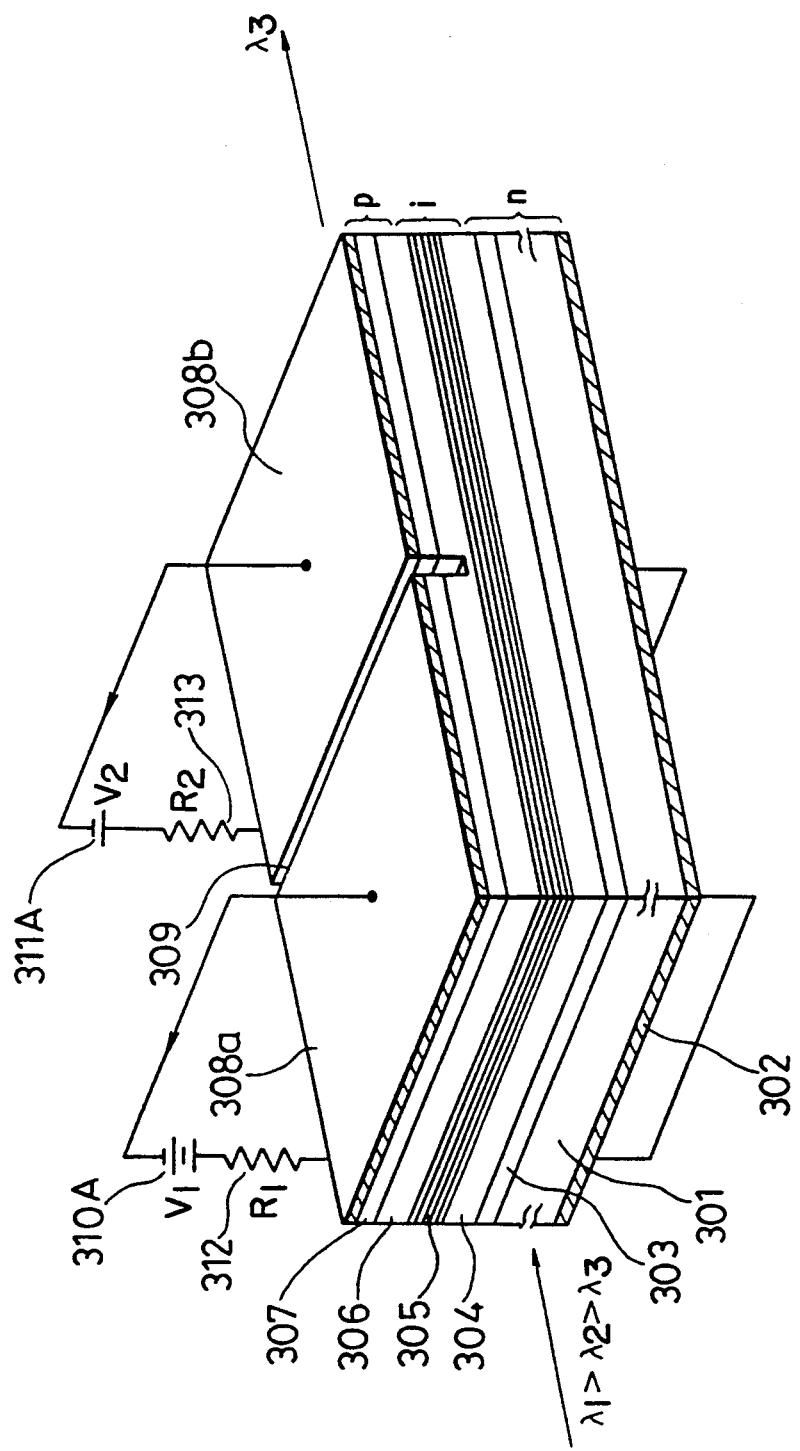
FIG. 14 is a schematic diagram of a light responsive semiconductor device according to an embodiment of the invention.

A further embodiment of the invention is shown in a perspective view in FIG. 14. In that embodiment, an n-type GaAs substrate 301 supports a plurality of layers on one side and has an electrode 302 disposed on its other side. The layers disposed on the substrate 301 comprise an n-type GaAs buffer layer 303, an n-type AlGaAs layer 304 grown on the buffer layer 303, a GaAs/AlGaAs multiple quantum well structure 305 disposed on layer 304, a p-type AlGaAs layer grown on the multiple quantum well structure 305, and a p-type GaAs contact layer 307 grown on the layer 306. A groove 309 extending through layer 307 and into layer 306 divides layer 307 into two portions. Respective electrodes 308a and 308b are disposed on those two portions of layer 307. As schematically illustrated in FIG. 14, a resistor 312 and a power supply 310A electrically connected in series are connected between the common electrode 302 and electrode 308a. Likewise, a constant voltage power supply 311A connected in series with a resistor 313 is connected across electrodes 302 and 308b. In each case, the cathode of the respective power supplies is connected to the electrodes 308a and 308b. As illustrated in FIG. 14, incident light containing a plurality of monochromatic light components is incident on a side, i.e., parallel to the interfaces between the layers, of the device adjacent electrode 308a. Any light that is transmitted after passage through the detector exits from the opposite side adjacent electrode 308b.

Figure 15:
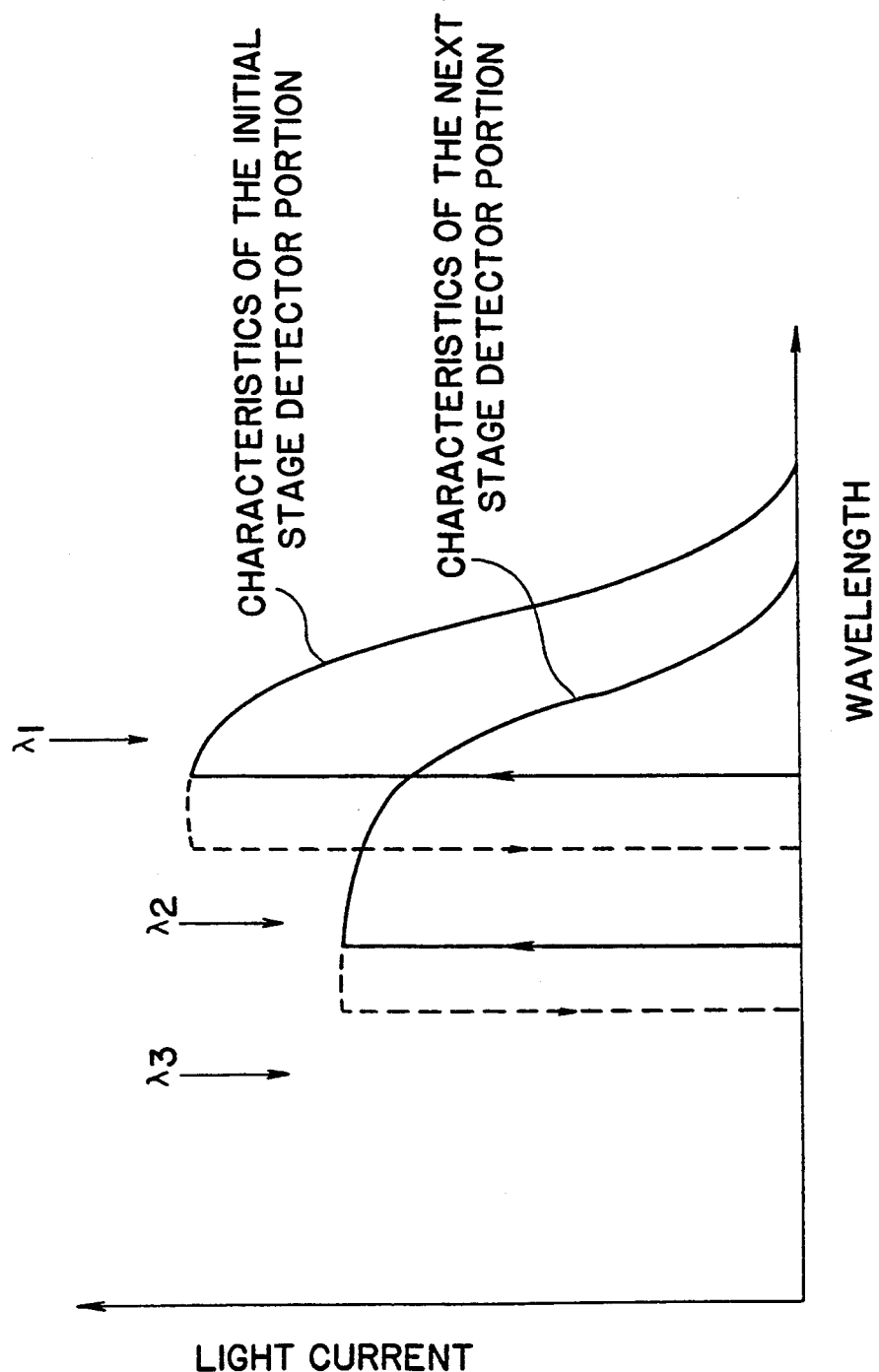
FIG. 15 is a diagram illustrating the light responsive characteristics of the device shown in FIG. 14.

FIG. 15 illustrates the relationship between the photocurrent of the two segments of the embodiment of FIG. 14 and the wavelength of incident light. The portion of the structure beneath electrode 308a is one segment of the device and the portion below electrode 308b is the other segment. By adjusting the voltages applied by the respective power supplies 310A and 311a and/or the values of the resistors 312 and 313, the wavelength response characteristics of the segments of the structure can be varied as shown in FIG. 15. Generally, the voltage $V_1$ of power supply 310A is larger than the voltage $V_2$ of the power supply 311a and the resistance $R_1$ of resistor 312 is smaller than the resistance $R_2$ of resistor 313. Although the structure has a bistable characteristic, it responds at the lower of the two bistable levels of the hysteresis characteristic to monochromatic incident light. The structure detects light of wavelength $\lambda_1$ at the first segment, detects light of wavelength $\lambda_2$ at the second segment, and transmits light of wavelength $\lambda_3$, where $\lambda_1 = \lambda_2 = \lambda_3$. The absorption end of the bistable characteristic is very sharp so that the wavelength selectivity of the structure is very high. In other words, the embodiment can detect wavelength differences between $\lambda_1$, $\lambda_2$, and $\lambda_3$ that are very small. As noted in FIG. 14, the order of the wavelength absorption, with the longer wavelength being first absorbed, is the reverse of that of the prior art device described in *Applied Physics Letters*, Volume 49, page 233, (1986).

The embodiment of the invention shown in FIG. 14 is a transverse form of the serial embodiment of FIG. 13. Since, in this embodiment, the electrode 308a is divided, the bistable response properties are obtained from an external resistor and the monochromatic components are separated using the steep absorption edge characteristic of the structure. Obviously, the structure of FIG. 14 can be extended to include a third segment, and further additional segments, for detecting the presence of additional monochromatic light components. By providing the proper electrical biasing of each segment, as illustrated in FIG. 15, the absorption characteristics of the multiple quantum well structure can be tuned to desired wavelengths with discontinuous photocurrent changes at the critical wavelengths.

We claim:

1. A light responsive semiconductor apparatus comprising:

first and second semiconductor light responsive devices, each device including an intrinsic layer in which a multiple quantum well structure is buried for the generation of a photocurrent in response to the absorption of incident light, each intrinsic layer being sandwiched between a p-type layer and an n-type layer, the light responsive devices being disposed on a continuous substrate wherein the intrinsic layers of the first and second devices are serially arranged for the passage of incident light substantially parallel to the layers sequentially through the first and second devices; and first and second external resistors respectively corresponding to said first and second devices and electrically connected across the respective devices for indicating the flow of a photocurrent generated in response to absorption of incident light by the respective devices, the values of the first and second resistors being chosen to provide a discontinuous change in the respective photocurrents of both devices at respective first and second critical wavelengths of incident light, the first critical wavelength being longer than the second critical wavelength.

2. A photodetector comprising:

a semiconductor substrate of a first conductivity type;

an intrinsic layer disposed on the substrate and including a multiple quantum well structure buried within the intrinsic layer for absorbing incident light and generating a photocurrent in response thereto;

at least first and second second conductivity type semiconductor layers electrically isolated from each other and disposed on the intrinsic layer;

a first common electrode disposed on the substrate;

first and second second electrodes respectively disposed on the first and second second conductivity type layer; and electrical biasing means for applying different electrical biases between the common electrode and the respective first and second second electrodes for establishing different, first and second critical wavelengths within the multiple quantum well layer opposite the first and second second electrodes for selectively absorbing components of light having wavelengths longer than the respective first and second critical wavelengths, the incident light in the incident generally parallel to the layers, sequentially passing between the first electrode and the first second electrode and the first electrode and the second second electrode, the first critical wavelength being longer than the second critical wavelength.

* * * * *